US008822842B2

(12) United States Patent  
Park et al.

(10) Patent No.: US 8,822,842 B2
(45) Date of Patent: Sep. 2, 2014

(54) EMI SHIELDING GASKET

(75) Inventors: In-Kil Park, Yongin-Si (KR); Dae Kyum Kim, Incheon (KR)

(73) Assignee: Innochips Technology Co., Ltd. (KR)

( * ) Notice: Subject to any disclaimer, the term of this patent is extended or adjusted under 35 U.S.C. 154(b) by 206 days.

(21) Appl. No.: 13/273,240

(22) Filed: Oct. 14, 2011

(65) Prior Publication Data

US 2012/0090885 A1  Apr. 19, 2012

(30) Foreign Application Priority Data

Oct. 14, 2010 (KR) ........................ 10-2010-0100438

(51) Int. Cl.
*H01R 4/00* (2006.01)
*H05K 9/00* (2006.01)

(52) U.S. Cl.
USPC .......................................... 174/366; 174/358

(58) Field of Classification Search
USPC .................................................. 174/366, 358
See application file for complete search history.

(56) References Cited

U.S. PATENT DOCUMENTS

| 4,371,175 | A | * | 2/1983 | Van Dyk, Jr. ................. 174/357 |
| 4,724,635 | A | * | 2/1988 | Side et al. ..................... 49/483.1 |
| 4,820,885 | A | * | 4/1989 | Lindsay ........................ 174/353 |
| 4,857,668 | A | * | 8/1989 | Buonanno .................... 174/354 |
| 4,934,666 | A | * | 6/1990 | Balsells ........................ 267/1.5 |
| 4,986,033 | A | * | 1/1991 | Weil ............................. 49/492.1 |
| 5,107,623 | A | * | 4/1992 | Weil ............................. 277/637 |
| 5,137,766 | A | * | 8/1992 | Mazanek et al. ................. 428/68 |
| 5,147,121 | A | * | 9/1992 | McIlwraith .................... 312/296 |
| 5,194,691 | A | * | 3/1993 | McIlwraith .................... 174/354 |
| 5,250,751 | A | * | 10/1993 | Yamaguchi .................... 174/354 |
| 5,522,602 | A | * | 6/1996 | Kaplo et al. .................... 277/650 |
| 5,597,652 | A | * | 1/1997 | Utsunomiya et al. ......... 428/382 |
| 6,073,896 | A | * | 6/2000 | McFadden ............... 248/231.81 |
| 6,116,615 | A | * | 9/2000 | Trehan ........................... 277/630 |
| 6,255,581 | B1 | * | 7/2001 | Reis et al. ...................... 174/388 |
| 6,477,061 | B1 | * | 11/2002 | Johnson ........................ 361/818 |
| 6,613,976 | B1 | * | 9/2003 | Benn, Jr. ........................ 174/358 |
| 6,639,145 | B1 | * | 10/2003 | Nurmi ........................... 174/387 |
| 6,696,639 | B1 | * | 2/2004 | Nurmi ........................... 174/363 |
| 6,818,822 | B1 | * | 11/2004 | Gilliland et al. .............. 174/357 |
| 6,943,288 | B1 |   | 9/2005 | Miska |
| 6,986,669 | B2 | * | 1/2006 | Kawai .............................. 439/66 |
| 7,129,421 | B2 | * | 10/2006 | Reis et al. ...................... 174/354 |
| 7,456,365 | B2 | * | 11/2008 | Gilliland et al. .............. 174/356 |

(Continued)

FOREIGN PATENT DOCUMENTS

| CN | 101276962 A | 10/2008 |
| CN | 101427618 A | 5/2009 |

(Continued)

OTHER PUBLICATIONS

Extended European Search Report for EP11184598.8, mailed Apr. 9, 2014.

*Primary Examiner* — Jeremy C Norris
*Assistant Examiner* — Nathan Milakovich

(57) ABSTRACT

Provided is an electromagnetic interference shielding gasket including an elastomer, and an electrode partially inserted and fixed in the elastomer, and bent along a side surface and a bottom surface of the elastomer. The electrode may be fixed through an adhesive tape to the bottom surface of the elastomer. Coupling force between the elastomer and the electrode is improved, and thus, a removal of the elastomer from the electrode after a mounting process is prevented.

5 Claims, 4 Drawing Sheets

(56) References Cited

U.S. PATENT DOCUMENTS

| | | | |
|---|---|---|---|
| 7,488,900 B1 * | 2/2009 | Kline | 174/355 |
| 7,591,666 B2 * | 9/2009 | Legrady et al. | 439/424 |
| 7,659,483 B2 * | 2/2010 | Gilliland et al. | 174/356 |
| 7,771,213 B2 * | 8/2010 | Kim et al. | 439/83 |
| 7,931,475 B2 * | 4/2011 | Kim et al. | 439/66 |
| 8,058,569 B2 * | 11/2011 | Kline | 174/355 |
| 2002/0195260 A1 * | 12/2002 | Marks | 174/35 R |
| 2004/0256129 A1 * | 12/2004 | Matsumoto et al. | 174/35 R |
| 2008/0061518 A1 | 3/2008 | Gilliland et al. | |
| 2009/0008431 A1 * | 1/2009 | Zonvide et al. | 228/179.1 |
| 2012/0090886 A1 * | 4/2012 | Park et al. | 174/358 |

FOREIGN PATENT DOCUMENTS

| | | | | |
|---|---|---|---|---|
| JP | 07015164 A | * | 1/1995 | H05K 9/00 |
| JP | 2002208792 A | * | 7/2002 | H05K 9/00 |
| JP | 2010283008 A | * | 12/2010 | |
| KR | 20-0447610 | | 2/2010 | |
| KR | 20100041975 A | | 4/2010 | |
| TW | 200612818 | | 4/2006 | |
| WO | 2004054344 A | | 6/2004 | |

* cited by examiner (a)

(b)

(c)

(a)

(b)

(c)

320(322,324,326,328)

(a)

(b)

(c)

420(422,424,426,428)

EMI SHIELDING GASKET

CROSS-REFERENCE TO RELATED APPLICATION

This application claims priority to Korean Patent Application No. 10-2010-0100438 filed on Oct. 14, 2010 and all the benefits accruing therefrom under 35 U.S.C. §119, the contents of which are incorporated by reference in their entirety.

BACKGROUND

The present disclosure relates to an electromagnetic interference (EMI) shielding gasket, and more particularly, to an EMI shielding gasket for a surface mount technology (SMT).

Electromagnetic waves may be emitted outward from a circuit of electronic devices through the atmosphere, or be transmitted through an electric wire. Various electromagnetic waves generated from a circuit of an electronic device may degrade the performance of peripheral electronic devices, make noise with peripheral electronic devices, damage an image formed by peripheral electronic devices, decrease the service life of peripheral electronic devices, and cause a defect in peripheral electronic devices. Furthermore, such electromagnetic waves may affect human bodies.

EMI shielding gaskets are used to address these issues. EMI shielding gaskets are disposed within a gap of a panel, a terminal, or a case of electronic devices such as mobile phones, LCD monitors, and computers, to prevent electromagnetic waves from being emitted from the electronic devices. As electronic devices are miniaturized, EMI shielding gaskets may be attached through surface mount on a printed circuit board (PCB). Such EMI shielding gaskets for a surface mount technology are required to have high electrical conductivity, excellent soldering properties, high heat resistance, and excellent elastic resilient characteristics.

However, an electrode of these EMI shielding gaskets may be removed from an elastomer after a mounting process, and thus, the EMI shielding gaskets may not perform their functions any more.

SUMMARY

The present disclosure provides an EMI shielding gasket adapted for a surface mount process.

The present disclosure also provides an EMI shielding gasket that prevents a removal of an electrode from an elastomer after a surface mount process.

The present disclosure also provides an EMI shielding gasket in which a portion of an electrode is fixed within an elastomer, to thereby prevent a removal of the electrode from the elastomer after a surface mount process.

In accordance with an exemplary embodiment, an electromagnetic interference shielding gasket includes: an elastomer; and an electrode partially inserted and fixed in the elastomer, and bent along a side surface and a bottom surface of the elastomer.

The electromagnetic interference shielding gasket may further include a hole that passes through the side surface of the elastomer.

The electrode may include: a fixing part disposed in the hole; a connecting part bent downward from the fixing part along the side surface of the elastomer; and a contact part bent from the connecting part along the bottom surface of the elastomer.

The fixing part may be indented.

The electromagnetic interference shielding gasket may further include at least one pin that protrudes from the fixing part, and is inserted and fixed in the elastomer within the hole.

The fixing part may be entirely disposed in the hole, and the contact part may be provided in plurality such that the contact parts are spaced apart from each other on the bottom surface of the elastomer.

The fixing part may be provided in plurality such that the fixing parts are spaced apart from each other in the hole, and the contact part may be entirely disposed on the bottom surface of the elastomer.

BRIEF DESCRIPTION OF THE DRAWINGS

Exemplary embodiments can be understood in more detail from the following description taken in conjunction with the accompanying drawings, in which.

DETAILED DESCRIPTION OF EXEMPLARY EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
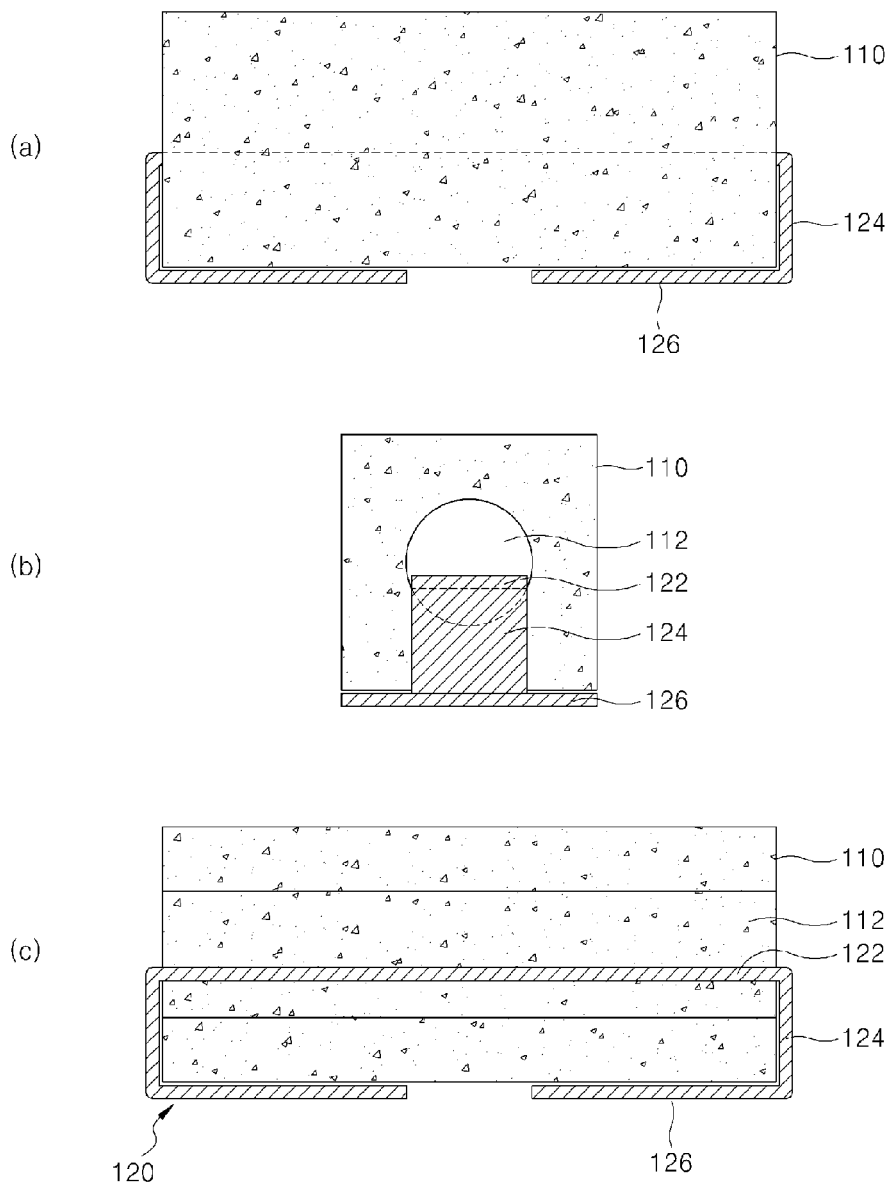
FIG. 1A is a front view illustrating an electromagnetic interference (EMI) shielding gasket in accordance with an exemplary embodiment.
FIG. 1B is a side view illustrating the EMI shielding gasket of FIG. 1A.
FIG. 1C is a cross-sectional view illustrating the EMI shielding gasket of FIG. 1B.

FIG. 1A is a front view illustrating an electromagnetic interference (EMI) shielding gasket in accordance with an exemplary embodiment. FIG. 1B is a side view illustrating the EMI shielding gasket of FIG. 1A. FIG. 1C is a cross-sectional view illustrating the EMI shielding gasket of FIG. 1B.

Referring to FIGS. 1A, 1B and 1C, the EMI shielding gasket includes an elastomer 110 through which a hole 112 laterally passes, and an electrode 120 passing through the hole 112 from a side of the bottom surface of the elastomer 110 to another side thereof.

For example, the elastomer 110 may have a rectangular parallelepiped shape with both square side and rectangular front, rear, top, and bottom surfaces. The elastomer 110 may be formed of a material having predetermined elasticity. For example, the elastomer 110 may include: a polymer synthetic resin such as polyurethane foam, polyvinyl chloride (PVC), silicone, ethylene vinylacetate copolymer, and polyethylene; rubber such as natural rubber (NR), styrene butadiene rubber (SBR), ethylene propylene diene monomer (EPDM) rubber, nitrile butadiene rubber (NBR), and neoprene; solid sheets; or a sponge sheet. However, the elastomer 110 is not limited thereto, and thus, may be formed of any elastic material. The elastomer 110 may have shock and vibration absorbing properties, surface resistivity, and vertical volume resistivity. The elastomer 110 may be conductive or non-conductive. When the elastomer 110 is conductive, the elastomer 110 may include carbon black, graphite, graphite, gold, silver, copper, nickel, or aluminum, which may be formed on the surface of the elastomer 110, or be contained in the elastomer 110. That is, the elastomer 110 in advance may be coated with a conductive material, or the elastomer 110 may be formed of a mixture of an elastic material and conductive fine powder. The hole 112 may pass through the elastomer 110 from a surface of the elastomer 110 to another surface thereof. The hole 112 improves the shock and vibration absorbing properties and elasticity of the elastomer 110. The hole 112 may have an approximately circular shape, or a tetragonal shape, but is not limited thereto. Since the elastomer 110 has elasticity, the hole 112 may be removed.

The electrode 120 passing through the hole 112 is exposed out of the elastomer 110, and exposed portions of the electrode 120 are bent along the side surfaces and bottom surface of the elastomer 110. That is, the electrode 120 includes a fixing part 122 disposed in the hole 112 of the elastomer 110, a plurality of connecting parts 124 bent downward from both ends of the fixing part 122 along the side surfaces of the elastomer 110, and a plurality of contact parts 126 bent from ends of the connecting parts 124 along the bottom surface of the elastomer 110. The contact parts 126 contact and are fixed through surface mount to a device such as a printed circuit board. The fixing part 122 is disposed in the elastomer 110 to fix the electrode 120, thereby preventing a removal of the electrode 120 from the elastomer 110. The connecting parts 124 connect the fixing part 122 to the contact parts 126. Although the electrode 120 is divided into the fixing part 122, the connecting parts 124, and the contact parts 126, the fixing part 122, the connecting parts 124, and the contact parts 126 may be integrally formed of the same material. The electrode 120 may be formed of a conductive material with a predetermined width. The fixing part 122 inserted in the hole 112 has a width equal to or smaller than the diameter of the hole 112. The connecting parts 124 and the contact parts 126 disposed out of the hole 112 may have a width equal to the width of the side surface of the elastomer 110. Thus, the electrode 120 may have a plate shape with a narrow middle portion and wider portions at both sides of the middle portion. Alternatively, the connecting parts 124 may be the same in width as the fixing part 122, and the contact parts 126 may be greater in width than the connecting parts 124 and the fixing part 122. Alternatively, the connecting parts 124 and the contact parts 126 may be the same in width as the fixing part 122. The electrode 120 may be formed of a conductive material including a metal such as aluminum, copper, nickel, gold, and silver. Alternatively, the electrode 120 may be formed by plating a fiber sheet with a metal, to thereby have flexibility.

As described above, a portion of the electrode 120 is inserted in the hole 112 laterally passing through the elastomer 110, and the rest of the electrode 120 is bent along the side surfaces and bottom surface of the elastomer 110, thereby forming the EMI shielding gasket. Since the portion of the electrode 120 is disposed in the hole 112 of the elastomer 110, coupling force between the elastomer 110 and the electrode 120 is increased, and thus, separation between the elastomer 110 and the electrode 120 after a mounting process is prevented.

Although the EMI shielding gasket is described with reference to the above embodiment, the present invention is not limited thereto. EMI shielding gaskets in accordance with a modified example and another exemplary embodiment will now be described. The same part as those of the previous embodiment will be omitted hereinafter, and a characterized part will now be principally described.

Figure 2:
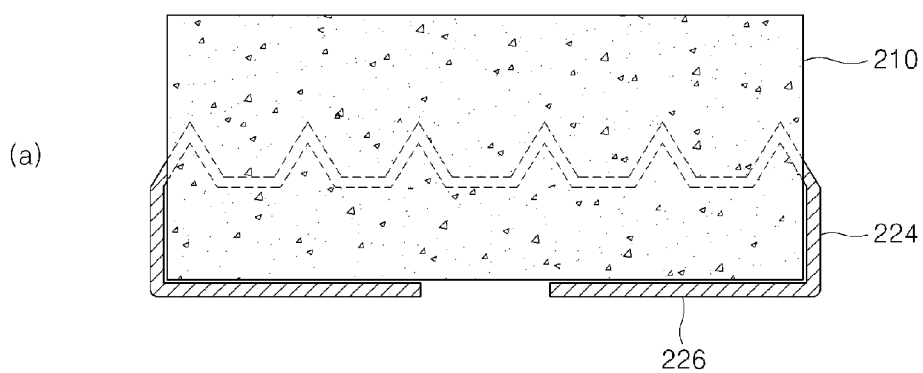
FIG. 2A is a front view illustrating an EMI shielding gasket in accordance with a modified example of the previous embodiment.
FIG. 2B is a side view illustrating the EMI shielding gasket of FIG. 2A.
FIG. 2C is a cross-sectional view illustrating the EMI shielding gasket of FIG. 2B.
Figure 2:
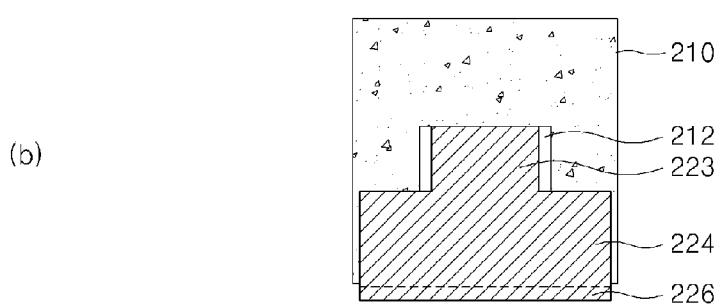
Figure 2:
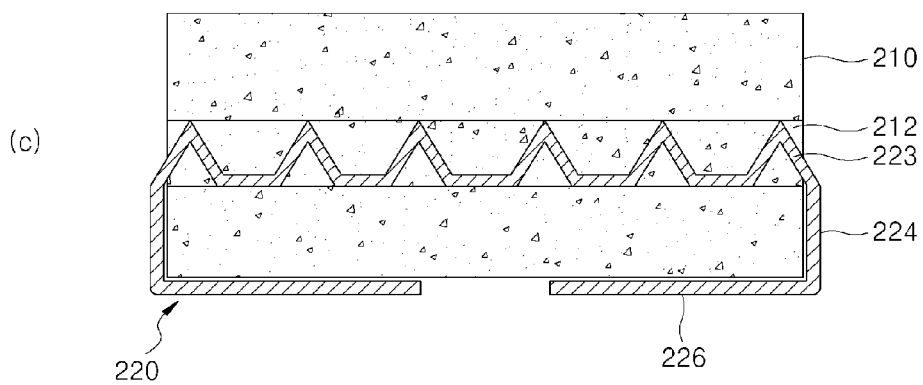

FIG. 2A is a front view illustrating an EMI shielding gasket in accordance with a modified example of the previous embodiment. FIG. 2B is a side view illustrating the EMI shielding gasket of FIG. 2A. FIG. 2C is a cross-sectional view illustrating the EMI shielding gasket of FIG. 2B.

Referring to FIGS. 2A, 2B and 2C, the EMI shielding gasket includes an elastomer 210 through which a hole 212 laterally passes, and an electrode 220 passing through the hole 212 from a side of the bottom surface of the elastomer 210 to another side thereof. The electrode 220 includes a fixing part 223 disposed in the hole 212 of the elastomer 210, a plurality of connecting parts 224 bent downward from both ends of the fixing part 223 along the side surfaces of the elastomer 210, and a plurality of contact parts 226 bent from ends of the connecting parts 224 along the bottom surface of the elastomer 210. The fixing part 223 is vertically indented such that the upper and lower portions of the fixing part 123 contact the elastomer 210 in the upper and lower portions of the hole 212. Alternatively, the fixing part 223 may be horizontally indented such that left and right indented portions of the fixing part 223 contact the elastomer 210 in the left and right portions of the hole 212. In this case, the hole 212 of the elastomer 210 may have a rectangular or square shape, and the diameter of the hole 212 may be adjusted to contact indented portions of the fixing part 223.

Figure 3:
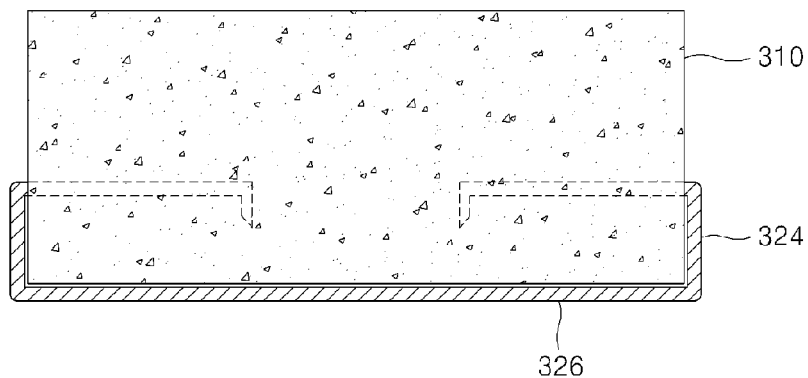
FIG. 3A is a front view illustrating an EMI shielding gasket in accordance with another exemplary embodiment.
FIG. 3B is a side view illustrating the EMI shielding gasket of FIG. 3A.
FIG. 3C is a cross-sectional view illustrating the EMI shielding gasket of FIG. 3B.
Figure 3:
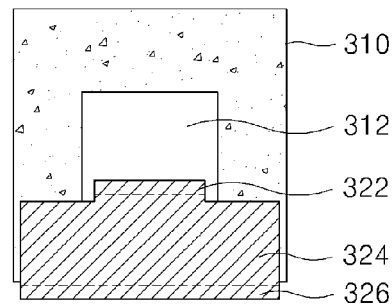
Figure 3:
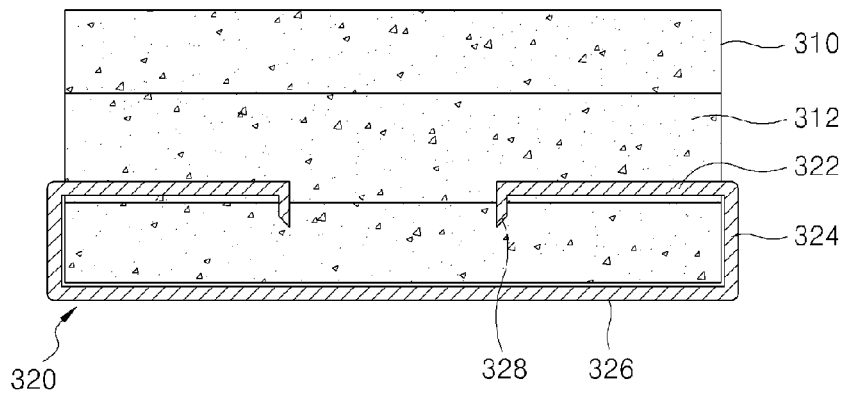

FIG. 3A is a front view illustrating an EMI shielding gasket in accordance with another exemplary embodiment. FIG. 3B is a side view illustrating the EMI shielding gasket of FIG. 3A. FIG. 3C is a cross-sectional view illustrating the EMI shielding gasket of FIG. 3B.

Referring to FIGS. 3A, 3B and 3C, the EMI shielding gasket includes an elastomer 310 through which a hole 312 laterally passes, and an electrode 320 including pins 328 that are disposed at ends of the electrode 320 and are inserted and fixed in the elastomer 310 within the hole 312 of the elastomer 310.

For example, the elastomer 310 may have a rectangular parallelepiped shape. The hole 312, which passes through a side surface of the elastomer 310 to another side surface thereof, improves shock and vibration absorbing properties and elasticity of the elastomer 310. The hole 312 may have a square shape. Accordingly, fixing parts 322 of the electrode 320 closely contact a portion of the elastomer 310 defining the bottom of the hole 312, without a gap, so that the pins 328 can be easily inserted and fixed to the elastomer 310.

The electrode 320 surrounds the bottom surface of the elastomer 310 and a portion of the side surfaces of the elastomer 310, and is partially inserted in the hole 312. That is, the electrode 320 includes the fixing parts 322 extending outward from a predetermined region of the hole 312, a plurality of connecting parts 324 bent downward from the fixing parts 322 along the side surfaces of the elastomer 310, and a contact part 326 connecting to the connecting parts 324 and disposed on the bottom surface of the elastomer 310. The pins 328 disposed at the ends of the electrode 320 face the connecting parts 324, and are bent downward. The pins 328 are inserted in the bottom of the hole 312 within the elastomer 310 to fix the electrode 320 to the elastomer 310.

As such, the pins 328 are disposed at the ends of the fixing parts 322 in the hole 312 of the elastomer 310, and are inserted in the elastomer 310, thus improving coupling force between the electrode 320 and the elastomer 310. Thus, a removal of the electrode 320 from the elastomer 310 after a mounting process is prevented.

Figure 4:
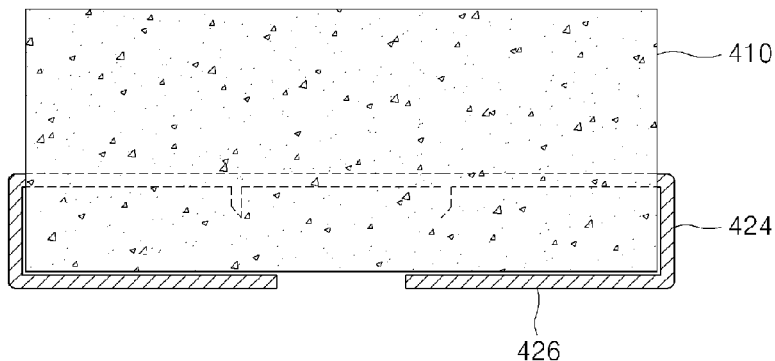
FIG. 4A is a front view illustrating an EMI shielding gasket in accordance with a modified example of the embodiment of FIG. 3A.
FIG. 4B is a side view illustrating the EMI shielding gasket of FIG. 4A.
FIG. 4C is a cross-sectional view illustrating the EMI shielding gasket of FIG. 4B.
Figure 4:
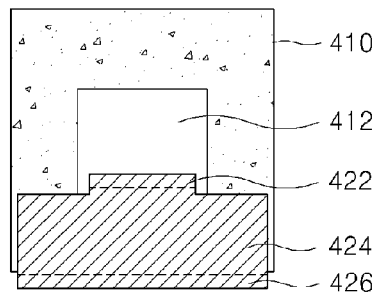
Figure 4:
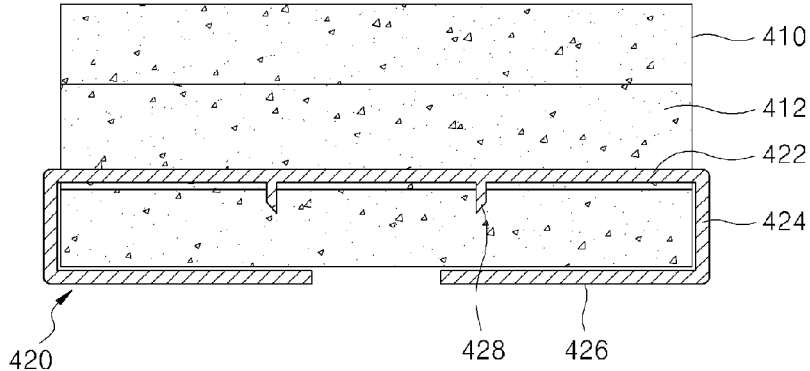

FIG. 4A is a front view illustrating an EMI shielding gasket in accordance with a modified example of the embodiment of FIG. 3A. FIG. 4B is a side view illustrating the EMI shielding gasket of FIG. 4A. FIG. 4C is a cross-sectional view illustrating the EMI shielding gasket of FIG. 4B.

Referring to FIGS. 4A, 4B and 4C, the EMI shielding gasket includes a fixing part 422 entirely disposed in a hole 412 of an elastomer 410, and one or more pins 428 extending downward from a portion of the fixing part 422. The pins 428 are inserted in a portion of the elastomer 410 defining the bottom of the hole 422, to fix an electrode 420 to the elastomer 410. The electrode 420 includes a plurality of connecting parts 424 bent along side surfaces of the elastomer 410, and a plurality of contact parts 426 bent along the bottom surface of the elastomer 410. The contact parts 426 are spaced apart from each other with the middle bottom of the elastomer 410 therebetween.

In accordance with the embodiments, a portion of the electrode is inserted in the hole laterally passing through the elastomer, and the rest of the electrode is bent along the side and bottom surfaces of the elastomer. That is, the electrode includes the fixing part disposed in the elastomer to fix the electrode, the connecting parts bent along the side surfaces of the elastomer from the fixing part, and the contact part bent along the bottom surface of the elastomer from the connecting parts. In addition, a portion of the fixing part may be provided with the pins bent or protruding downward, which are inserted and fixed in the elastomer.

Although the EMI shielding gasket has been described with reference to the specific exemplary embodiments, it is not limited thereto. Therefore, it will be readily understood by those skilled in the art that various modifications and changes can be made thereto without departing from the spirit and scope of the present invention defined by the appended claims.

What is claimed is:

1. An electromagnetic interference shielding gasket comprising:
    an elastomer comprising a hole that passes through a side surface thereof; and
    an electrode partially inserted and fixed in the elastomer, and bent along the side surface and a bottom surface of the elastomer,
    wherein the electrode is provided in the hole, the electrode comprising:
        a fixing part in contact with the elastomer in the hole;
        a connecting part connected to the fixing part and in contact with the side surface of the elastomer; and
        a contact part connected to the connecting part and in contact with the bottom surface of the elastomer.

2. The electromagnetic interference shielding gasket of claim 1, wherein the fixing part is indented.

3. The electromagnetic interference shielding gasket of claim 1, further comprising at least one pin that protrudes from the fixing part, and is inserted and fixed in the elastomer within the hole.

4. The electromagnetic interference shielding gasket of claim 1, wherein the fixing part is directly disposed in the hole, and the contact part is provided in plurality such that the contact parts are spaced apart from each other on the bottom of the elastomer.

5. The electromagnetic interference shielding gasket of claim 1, wherein the fixing part is provided in plurality such that the fixing parts are spaced apart from each other in the hole, and the contact part is entirely disposed on the bottom surface of the elastomer.

* * * * *